(12) United States Patent (10) Patent No.: US 8,822,342 B2
Srivastava et al. (45) Date of Patent: Sep. 2, 2014

(54) METHOD TO REDUCE DEPTH DELTA BETWEEN DENSE AND WIDE FEATURES IN DUAL DAMASCENE STRUCTURES

(75) Inventors: Ravi Prakash Srivastava, Fishkill, NY (US); Oluwafemi. O. Ogunsola, Hopewell Junction, NY (US); Craig Child, Hopewell Junction, NY (US); Muhammed Shafi Kurikka Valappil Pallachalil, Wappingers Falls, NY (US); Habib Hichri, Poughkeepsie, NY (US); Matthew Angyal, Stormville, NY (US); Hideshi Miyajima, Clifton Park, NY (US)

(73) Assignees: GLOBALFOUNDRIES Singapore Pte. Ltd., Singapore (SG); International Business Machines Corporation; Advanced Micro Devices Corporation; Infineon Technologies North America Corp.; Toshiba America Electronic Components, Inc.

( * ) Notice: Subject to any disclaimer, the term of this patent is extended or adjusted under 35 U.S.C. 154(b) by 357 days.

(21) Appl. No.: 12/981,519

(22) Filed: Dec. 30, 2010

(65) Prior Publication Data
US 2012/0168957 A1 Jul. 5, 2012

(51) Int. Cl.
*H01L 21/311* (2006.01)
*H01L 21/768* (2006.01)

(52) U.S. Cl.
CPC ... *H01L 21/76813* (2013.01); *H01L 2221/1036* (2013.01)
USPC .......................................... 438/702; 438/700

(58) Field of Classification Search
CPC ................................................ H01L 2221/1036
USPC .......................................... 438/778, 700, 702
See application file for complete search history.

(56) References Cited

U.S. PATENT DOCUMENTS

| 5,330,879 | A * | 7/1994 | Dennison | 430/313 |
| 6,251,791 | B1 * | 6/2001 | Tsai et al. | 438/700 |
| 6,291,312 | B1 * | 9/2001 | Chan et al. | 438/444 |
| 6,713,835 | B1 * | 3/2004 | Horak et al. | 257/522 |
| 2005/0153541 | A1 * | 7/2005 | Lee et al. | 438/638 |
| 2008/0191352 | A1 * | 8/2008 | Yu et al. | 257/751 |
| 2010/0243605 | A1 * | 9/2010 | Nishizuka | 216/67 |
| 2011/0189438 | A1 * | 8/2011 | Furusho | 428/156 |

* cited by examiner

*Primary Examiner* — Allen Parker
(74) *Attorney, Agent, or Firm* — Horizon IP Pte. Ltd.

(57) ABSTRACT

A method of forming a device is disclosed. The method includes providing a substrate prepared with a dielectric layer having first and second regions. The first region comprises wide features and the second region comprises narrow features. A depth delta exists between bottoms of the wide and narrow features. A non-conformal layer is formed on the substrate and it lines the wide and narrow trenches in the first and second regions. The non-conformal layer is removed. Removing the non-conformal layer reduces the depth delta between the bottoms of the wide and narrow features in the first and second region.

18 Claims, 17 Drawing Sheets

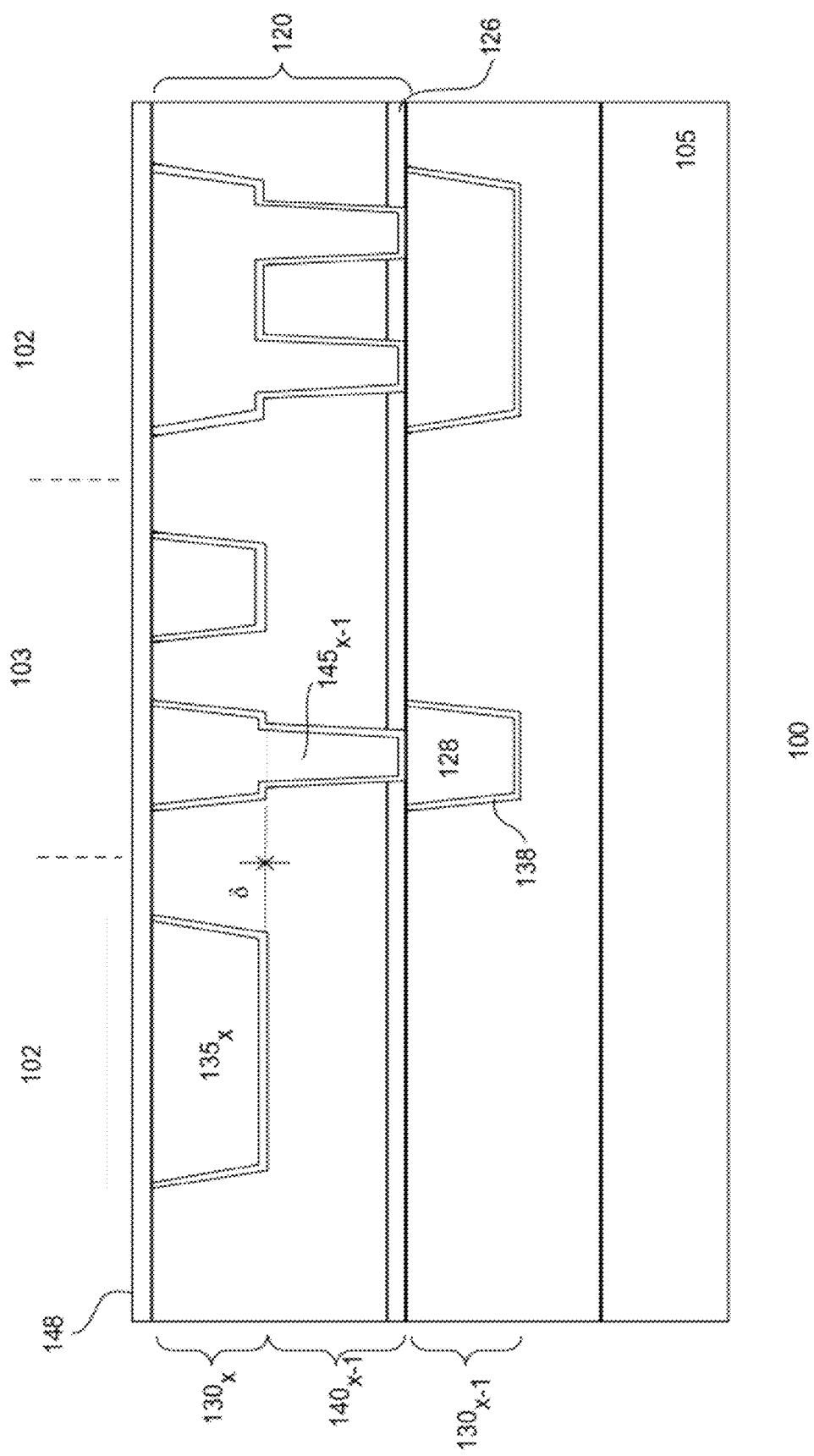

“METHOD TO REDUCE DEPTH DELTA BETWEEN DENSE AND WIDE FEATURES IN DUAL DAMASCENE STRUCTURES”

BACKGROUND

The fabrication of integrated circuits (ICs) involves the formation of features on a substrate that make up circuit components, such as transistors, resistors and capacitors. The devices are interconnected, enabling the IC to perform the desired functions. Interconnections are formed by forming contacts and conductive lines in a dielectric layer using, for example, damascene techniques. A damascene structure, for example, includes a via or contact hole in a lower portion and a trench which is generally wider than the contact hole in an upper portion. The via serves as a contact to a device while the trench contains the conductive line for connecting the device to, for example, other devices.

As critical dimensions (CD) continue to shrink, ultra-low k dielectric (ULK) material has been proposed. However, the porosity nature of the ultra-low k dielectric material often results in integration problems, such as severe undercut and over etched in the etch profile. One example of such problems being that the depth delta between dense and wide features increases significantly from dual damascene trench reactive ion etching (RIE) plus dilute hydrofluoric acid (DHF) clean to the metallization process.

From the foregoing discussion, it is desirable to improve the depth delta between the dense and wide features in dual damascene structures in order to obtain good integration of interconnect.

SUMMARY

The present invention relates to devices, such as semiconductor devices or ICs, more particularly to dual damascene interconnections.

A method of forming a device is disclosed. The method includes providing a substrate prepared with a dielectric layer having first and second regions. The first region comprises wide features and the second region comprises narrow features. A depth delta exists between bottoms of the wide and narrow features. A non-conformal layer is formed on the substrate and it lines the wide and narrow trenches in the first and second regions. The non-conformal layer is removed. Removing the non-conformal layer reduces the depth delta between the bottoms of the wide and narrow features in the first and second region.

In another embodiment, a method of forming a device is presented. The method includes providing a substrate prepared with a dielectric layer having first and second regions. The first region comprises wide dual damascene features and the second region comprises narrow dual damascene features. A depth delta exists between bottoms of wide and narrow trenches of the wide and narrow dual damascene features. A non-conformal layer is formed on the substrate and it lines the wide and narrow dual damascene features in the first and second regions. The non-conformal layer is removed, for example, during an etch stop removal step. Removing the non-conformal layer reduces the depth delta between the bottoms of the wide and narrow trenches of the wide and narrow dual damascene features in the first and second region.

In yet another embodiment, a device is disclosed. The device includes a substrate prepared with a dielectric layer having first and second regions. It also includes wide dual damascene features in the first region and narrow dual damascene features in the second region. A depth delta of trenches of the wide and narrow dual damascene structures is reduced.

These and other objects, along with advantages and features of the present embodiment herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the embodiment. In the following description, various embodiments are described with reference to the following drawings, in which:

FIG. 1 shows a cross-sectional view of an embodiment of portion of a device;

DETAILED DESCRIPTION

Figure 2A:
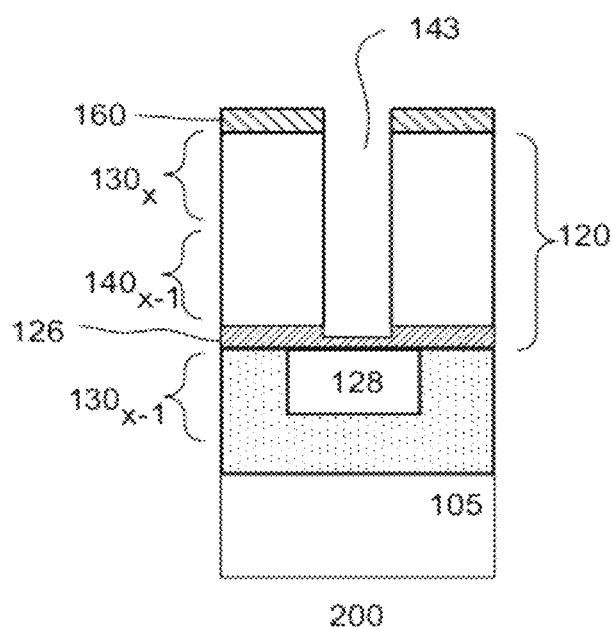
FIGS. 2a-h show a process of forming a dual damascene structure.

The present embodiments generally relate to devices, such as semiconductor devices or ICs. More particularly, some embodiments relate to method of improving interconnections and processes for forming such in ICs. The ICs can be any type of IC, for example dynamic or static random access memories, signal processors, or system on chip devices. The ICs can be incorporated into, for example, consumer electronic products, such as computers, cell phones, and personal digital assistants (PDAs). Other types of devices or products are also useful.

FIG. 1 shows a cross-sectional view of an embodiment of a device 100. A portion of the device, such as an integrated circuit (IC), is shown. Other types of devices may also be employed. The portion of the device includes a substrate 105. The substrate, for example, comprises a silicon substrate. Other types of substrates, such as silicon germanium or silicon-on-insulator (SOI), are also useful. The substrate may include circuit components (not shown) such as transistors, capacitors, or resistors formed thereon. Other types of circuit components are also useful.

On the substrate are provided interconnects to electrically couple the circuit components as desired to form the device. The interconnects are generally provided in a plurality of interconnect levels 120, wherein 1 is the lowest interconnect level and n is the highest interconnect level.

Interconnects are formed in an intermetal dielectric (IMD) layer 120. An IMD layer includes a trench level $130_x$ in an upper portion which corresponds to the metal level ($M_x$). For example, interconnects or metal lines $135_x$ are disposed in the trench level $130_x$ of the IMD layer. A lower portion of the IMD layer includes a via level $140_{x-1}$ having contacts $145_{x-1}$. The heights of the trench level and via level may depend on design requirements. Typically, for dual damascene structures, the trench level has a height which is about 1.5 times the height of the via level. Other heights for trench and via levels may also be useful.

In one embodiment, the interconnects and contacts are disposed in dual damascene structures formed in the IMD layer. The dual damascene structure, for example, comprises trenches in the trench level in communication with vias in the via level. Generally, interconnects and contacts are formed in dual damascene structures for metal levels M2 and above. In the case of the first metal level (e.g., M1), the interconnects and contacts are formed in single damascene structures. The contacts are, for example, located in a premetal dielectric (PMD) level.

The contacts couple the interconnects $135_x$ to contact areas 128 below. Depending on the interconnect level, the contact regions can be interconnects of a lower trench level $130_{x-1}$. For example, in the case where x is ≥2 (M2 or above), the contact areas comprise interconnects. In some cases, the contact area may comprise active device regions, such as diffusion regions of transistors, transistor gates, capacitor plates, or other types of regions or a combination thereof. For example, in the case where x=1 (M1), the contacts are in the PMD level and the contact areas comprise active device regions.

It is understood that the different IMD levels need not be the same. For example, different materials or constructions may be employed for different IMD levels. In some embodiments, the upper IMD levels are the same while the lowest IMD level is different. Other configurations of IMD levels are also useful.

The conductive lines and contacts comprise a conductive material. The conductive material may be any metal or alloy. For example, the conductive material may comprise copper, aluminum, tungsten, their alloys, or a combination thereof. Other conductive materials may also be useful. The interconnects and contacts may comprise the same material. For example, interconnects and contacts formed in dual damascene structures comprise the same materials. In some embodiments, the interconnects and contacts may comprise different materials. For example, the contacts may comprise tungsten while the interconnects may comprise copper. Such a configuration may be useful for PMD and M1 levels.

As shown, the conductive line and/or contact may be provided with slanted sidewalls. The slanted sidewall profile can improve sidewall barrier and seed coverage during processing. The slanted sidewalls, for example, comprise an angle of about 85-89°. Alternatively, the conductive lines and/or contacts are provided with vertical or substantially vertical sidewalls.

A lower etch stop layer 126 may be provided separating the IMD layer and contact areas. The lower etch stop layer comprises, for example, a dielectric material. In one embodiment, the dielectric layer comprises a low k dielectric material. Various types of low k dielectric material, such as SiC, Black Diamond, Blok, NBlok, silicon nitride or a combination thereof may be used. In one embodiment, the lower etch stop layer comprises NBLOK. Other types of dielectric materials, such as a combination of Blok and NBlok may also be useful. The contacts penetrate through the lower etch stop layer to the contact area, ensuring electrical coupling between the contacts and contact areas. The thickness of the etch stop layer, for example, may be about 25-150 nm. Other thicknesses may also be useful.

A barrier layer 138 can be provided to line the trench and/or via sidewalls and bottoms. The barrier serves to protect, for example, the conductive material from diffusing into the IMD layer. The barrier, for example, can comprise a conductive material such as tantalum nitride (TaN), tantalum (Ta), titanium nitride (TiN) or a combination thereof. Other type of barrier material, such as ruthenium, is also useful. In other embodiments, the barrier layer may comprise non-conductive materials. In such applications, the barrier layer does not line the bottom of the via, enabling electrical coupling between the contact and contact region below.

An upper etch stop layer 148 may be provided over the IMD layer. The etch stop layer, for example, is disposed on the surface of IMD layer and interconnects. The etch stop layer comprises a dielectric material. In one embodiment, the etch stop layer comprises a low k dielectric material, such as SiC, Black Diamond, Blok, NBlok, SiN or a combination thereof. In one embodiment, the upper etch stop layer comprises NBLOK. Other types of etch stop materials may also be useful. The etch stop layer may also serve as a capping layer of the IMD layer. The thickness of the etch stop layer may be about 250-1500 Å. Other thicknesses are also useful.

The IMD layer, in one embodiment, comprises a dielectric material. In one embodiment, the dielectric material comprises an ultra low-k (ULK) dielectric material. The ULK material, for example, comprises porous SiCOH. Other types of dielectric materials may also be useful. The ULK material can be formed by various techniques such as spin on or chemical vapor deposition. The ULK material may be annealed to form porogens, lowering the k value of the dielectric material. Other types or processes for forming the dielectric materials may also be useful.

The IMD layer may comprise wide interconnects in a wide region 102 and narrow interconnects in a narrow or dense region 103. The wide interconnects include, for example, dual contacts. In a dual contact configuration, first and second contacts are disposed adjacent to each other. As for the narrow interconnects, they include single contacts. In a single contact configuration, a single contact is provided to couple an interconnect to a lower contact area. Other configurations may also be useful.

We have discovered that, in conventional IMD layers, there exists a difference in depth (depth delta (δ)) between features in the wide and dense regions. For example, there exists a depth δ between wide trenches and narrow trenches in the wide and dense regions for dual damascene structures. The depth of the wide trenches is deeper than the depth of the narrow trenches. The depth δ increases with subsequent processing to complete formation of the interconnects and contacts. The depth δ of trenches in the wide and narrow regions can be, for example, about 25%. This can cause shorts in the inter-level metal layer and inter-level time dependent dielectric breakdown (TDDB) problems.

In accordance with one embodiment, the depth δ of wide and narrow features is reduced. In one embodiment, the depth δ of wide and narrow trenches of dual damascene structures is reduced. In one embodiment, the depth δ of wide and narrow trenches is reduced to less than 15%. In one embodiment, the depth δ of wide and narrow trenches is reduced to less than 11%. In one embodiment, the depth δ of wide and narrow trenches is reduced to less than 6%.

FIGS. 2a-2h show an embodiment of a process for forming a dual damascene structure of a device 200. Referring to FIG. 2a, a substrate 105 is provided. The substrate, for example, comprises a p-type silicon substrate. Other types of substrates, such as a germanium-based, gallium arsenide, silicon-on-insulator (SOI), or sapphire substrate, are also useful. The substrate can be prepared with circuit components (not shown). Circuit components can include, for example, transistors, capacitors and/or resistors. Other types of circuit components are also useful.

The substrate is further prepared with a dielectric layer 120. The dielectric layer, for example, will serve as an IMD layer 120. In one embodiment, the dielectric layer comprises a ULK material. Various types of ULK materials may be used to form the dielectric layer. In one embodiment, the ULK material comprises BCHD 2.4. The ULK material may be deposited by, for example, CVD or spin on techniques. Other deposition techniques may also be useful. After the ULK material is deposited on the substrate, it is annealed to form porogens. Annealing, for example, is performed in a UV curing chamber. In alternative embodiments, other types of ULK or non-ULK dielectric materials or formatting processes may also be used to form the dielectric layer.

A lower etch stop layer 126 may be provided below the dielectric layer. The lower etch stop layer, for example, separates the IMD layer from the substrate and contact areas 128. The lower etch stop layer comprises, for example, a dielectric material. In one embodiment, the dielectric material comprises a low k dielectric material. Various types of low k dielectric material, such as SiC, Black Diamond, Blok, NBlok, SiN or a combination thereof, may be used. In one embodiment, the lower etch stop layer comprises NBLOK. Other types of dielectric materials may also be useful. The etch stop layer may be formed by, for example, CVD.

The dielectric layer includes a trench level $130_x$ in an upper portion which corresponds to the metal level ($M_x$). A lower portion of the dielectric layer includes a via level $140_{x-1}$.

In one embodiment, a mask 160 is formed over the dielectric layer. The mask, for example, comprises a hard mask. Various types of materials, such as TEOS, SiN, or low K based materials, may be used to serve as the hard mask. Other types of hard mask materials may also be useful. The hard mask is patterned to create an opening corresponding to a via. In one embodiment, the hard mask is about 25 nm thick. Providing a hard mask with other thicknesses is also useful. The hard mask may be patterned using, for example, a soft mask (not shown), such as photoresist. An anti-reflective coating (ARC) may be disposed below the soft mask to improve lithographic resolution.

An anisotropic etch, such as a reactive ion etch (RIE), is performed to remove a portion of the dielectric layers unprotected by the mask to form a via 143. The etch, in one embodiment, stops on the lower etch stop layer. As such, the lower etch stop layer covers the contact area. The via may comprise slanted or vertical sidewalls.

Figure 2B:
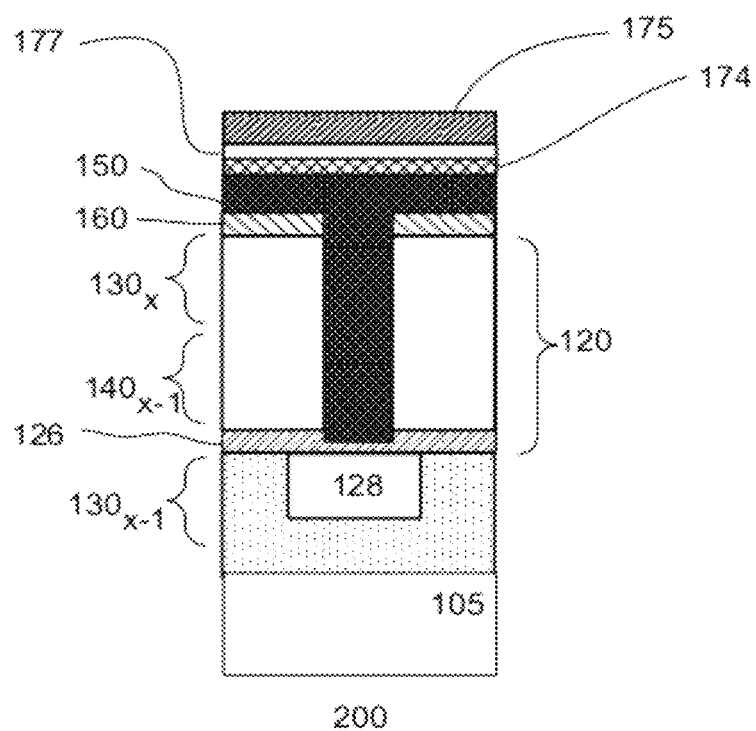

After forming the via, the process proceeds to form the trench in the trench level. In one embodiment, as shown in FIG. 2b, a sacrificial layer 150 is deposited on the substrate. The sacrificial layer, in one embodiment, comprises a planarizing material. In one embodiment, the sacrificial layer comprises an organic planarizing layer (OPL). Other types of sacrificial layers may also be useful. The sacrificial layer fills the via and covers the dielectric layer. For example, the OPL fills the via and covers the surface of the hard mask layer. The sacrificial layer provides a planar top surface over the dielectric layer after filling the via opening. The OPL comprises, for example, HM8006 or NFC-1400. The OPL may be deposited by spin on techniques. Other OPL materials or deposition techniques may also be useful.

In one embodiment, a dielectric layer 174 is formed over the OPL layer. The dielectric layer comprises, for example, a low temperature oxide (LTO) layer. In one embodiment, the dielectric layer serves as an intermediate hard mask.

A soft mask 175 is provided over the dielectric layer. In one embodiment, the soft mask comprises photoresist. The soft mask may be formed by spin on techniques. To improve lithographic resolution, an ARC 177 is provided below the soft mask. The ARC, for example, may be an organic or inorganic ARC. Other types of ARC materials may also be useful. Various techniques, such as CVD or spin on, may be employed to form the ARC.

Figure 2C:
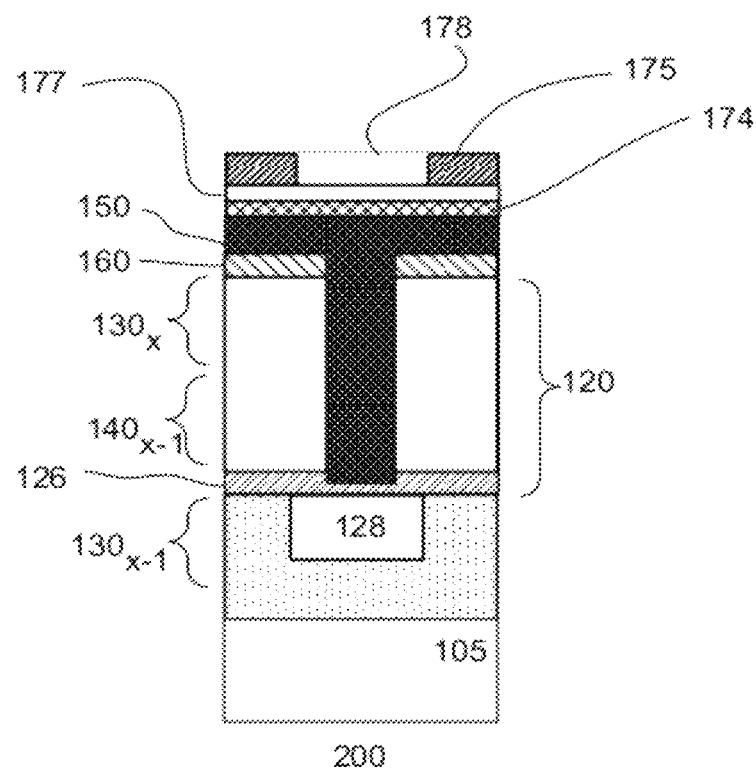

Referring to FIG. 2c, the soft mask is patterned to create an opening 178 corresponding to a trench. The soft mask can be patterned by selectively exposing it to an exposure source with a photomask containing the desired pattern. The soft mask is developed after exposure, transferring the pattern of the photomask to the soft mask.

Figure 2D:
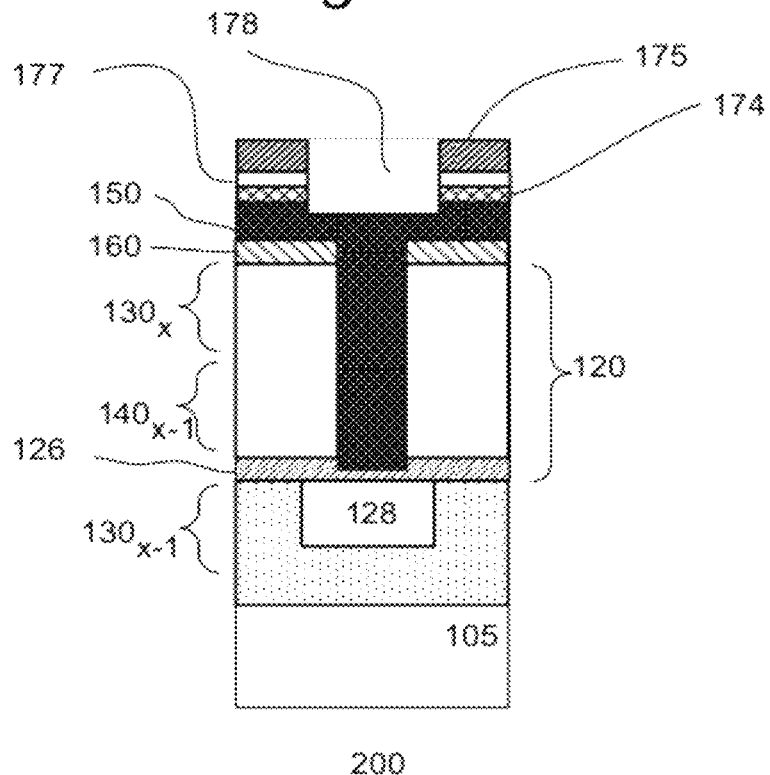

In FIG. 2d, the ARC 177 and dielectric layer 174 is patterned using the soft mask. In one embodiment, the ARC and dielectric layer are patterned by an anisotropic etch, such as a RIE.

Figure 2E:
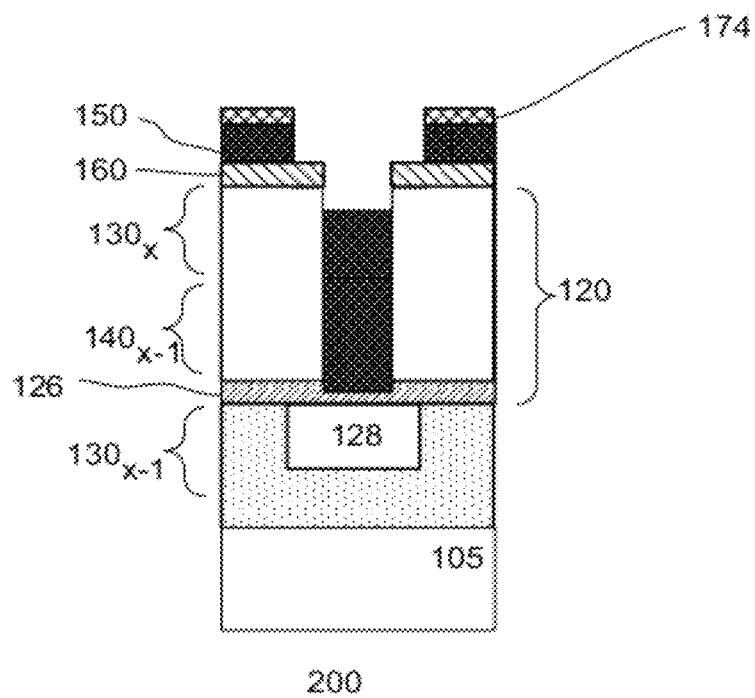

As shown in FIG. 2e, the sacrificial layer is patterned. In one embodiment, the sacrificial layer is patterned using the intermediate hard mask 174. Patterning the sacrificial layer is performed by, for example, an anisotropic etch such as RIE. The patterning of the sacrificial layer is selective to the dielectric layer 174 and hard mask 160.

Figure 2F:
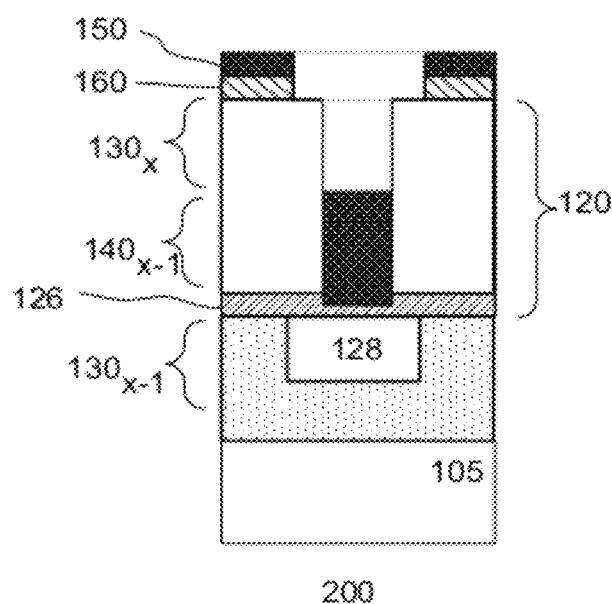

After patterning the sacrificial layer, an etch is performed to pattern the hard mask 160, as illustrated in FIG. 2f. This etch, for example, comprises an anisotropic etch which is selective to the sacrificial material. The sacrificial material, for example, serves as an etch mask to pattern the hard mask.

Figure 2G:
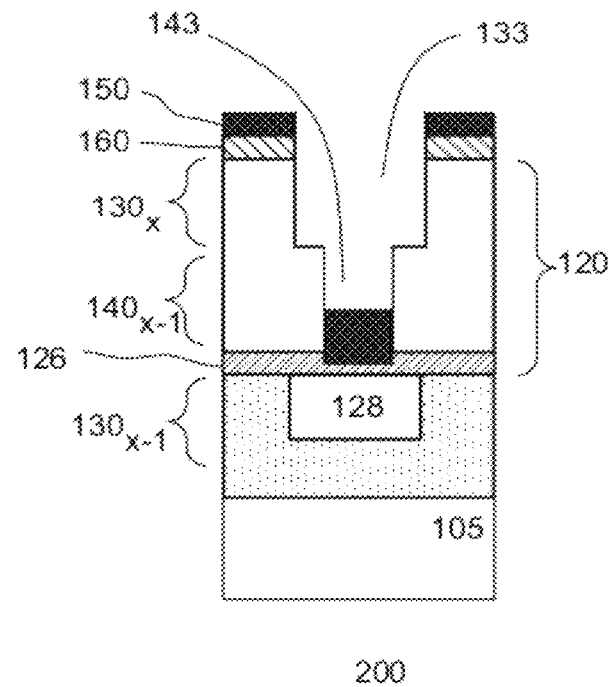

In FIG. 2g, the IMD layer is patterned to form a trench 133 in the upper portion $130_x$. In one embodiment, the dielectric layer is patterned by an anisotropic etch, such as RIE, selective to the hard mask material. The patterning of the IMD layer, for example, leaves remaining portion of the sacrificial layer.

Figure 2H:
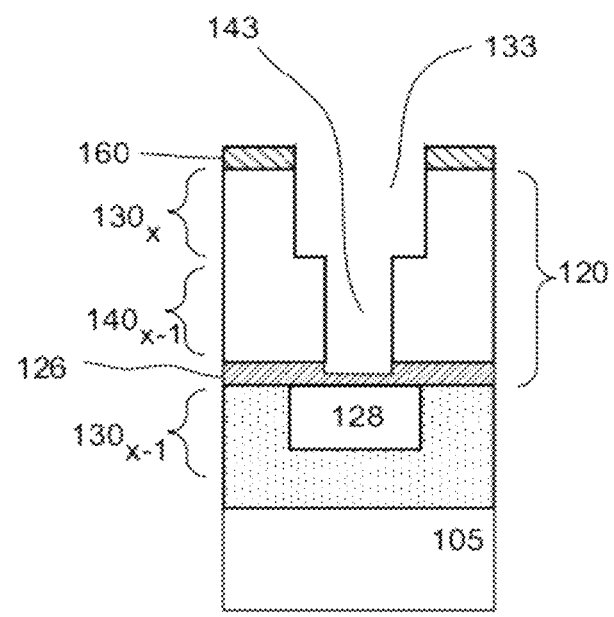

Remaining portions of the sacrificial layer 150, as shown in FIG. 2h, are removed. For example, the remaining portions of the OPL are removed by ashing. Other techniques may also be used to remove the remaining portions of the OPL. As shown, a partially processed dual damascene structure is formed. The partially processed dual damascene structure includes a trench 133 in an upper portion in communication with a via 143 in a lower portion of the dielectric layer. The bottom of the via does not penetrate through the lower etch stop layer.

As described, the process forms dual damascene structures using trench first processes. Alternatively, the dual damascene structure may be formed by via first processes. Other types of processes for forming dual damascene structures or damascene structures may also be useful.

Figure 3A:
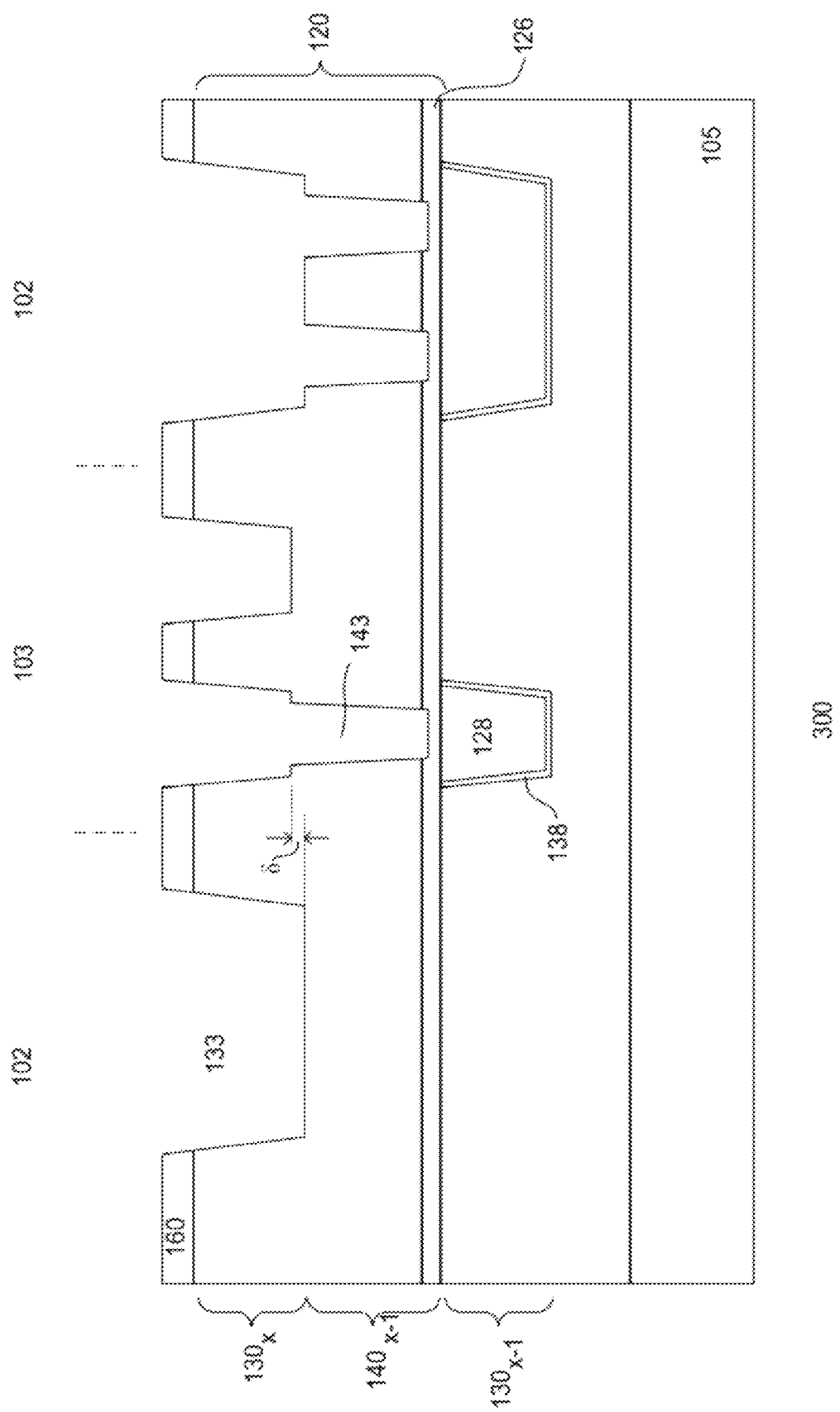
FIGS. 3a-g show a process for forming interconnects.

FIGS. 3a-g show an embodiment of a process for forming interconnects. Referring to FIG. 3a, a portion 300 of a device is shown. The device, for example, may be an integrated circuit (IC). Other types of devices may also be employed. The portion of the device includes a substrate 105. The substrate, for example, comprises a silicon substrate. Other types of substrates, such as silicon germanium or silicon-on-insulator (SOI), are also useful. The substrate may include circuit components (not shown), such as transistors, capacitors, or resistors formed thereon. Other types of circuit components are also useful.

The substrate is prepared with an intermetal dielectric (IMD) layer 120. The IMD layer may correspond to any interconnect or metal (M) level of the device. For example, the IMD layer may correspond to the $x^{th}$ level ($M_x$) of the device.

The IMD layer, in one embodiment, comprises a dielectric material. In one embodiment, the dielectric material comprises an ultra low-k (ULK) dielectric material. The ULK material, for example, comprises BCHD 2.4. Other types of ULK or dielectric materials may also be useful. The ULK material can be formed by various techniques such as spin on or chemical vapor deposition. The ULK material may be annealed to form porogens, lowering the k value of the dielectric material. Other types of processes for forming the dielectric materials may also be useful.

The IMD layer is prepared with dual damascene structures having trenches 133 in a trench level $130_x$ and vias 143 in a via level $140_{x-1}$. The trench level corresponds to a metal level ($M_x$). Interconnects or metal lines are disposed in the trenches of the trench level and contacts in vias of the via level. The dual damascene structure may be formed with slanted sidewalls. The slanted sidewalls, for example, comprise an angle of about 85-89°. Alternatively, the conductive lines and/or contacts are provided with vertical or substantially vertical sidewalls.

In one embodiment, a hard mask 160 is formed over the IMD layer. The hard mask may comprise, for example, TEOS. Other types of hard mask materials may also be useful. The hard mask is used to form the dual damascene structure.

The IMD layer may comprise wide and narrow regions 102 and 103. The wide regions, for example, include wide trenches and the narrow regions include narrow trenches. Dual damascene structures may include dual contacts in the wide regions and single contacts in the narrow regions.

In one embodiment, the IMD layer is formed over a lower metal level ($M_{x-1}$). For example, contact areas 128 which correspond to interconnects are provided in a lower trench level $130_{x-1}$. The interconnects may be lined with a barrier layer 138, such as tantalum nitride (TaN), tantalum (Ta), titanium nitride (TiN) or a combination thereof. Other type of barrier material, such as ruthenium, is also useful.

A lower etch stop layer 126 separates the IMD layer and the lower trench level. The lower etch stop layer comprises, for example, a dielectric material. In one embodiment, the dielectric layer comprises a low k dielectric material. Various types of low k dielectric material, such as SiC, Black Diamond, Blok, NBlok, SiN or a combination thereof, may be used. In one embodiment, the lower etch stop layer comprises NBlok. Other types of dielectric materials or combination of materials may also be useful.

At this point in the process, the vias of the dual damascene structure do not penetrate through the lower etch stop layer to expose the contact area. As previously described, there exists a depth delta ($\delta$) between features in the wide and dense regions. For example, there exists a depth $\delta$ between wide trenches and narrow trenches in the wide and dense regions for dual damascene structures. The depth of the wide trenches, in one embodiment, is deeper than the depth of the narrow trenches. This may be caused by, for example, etch or RIE lag. The depth 6 increases with subsequent processing to complete formation of the interconnects and contacts.

Figure 3B:
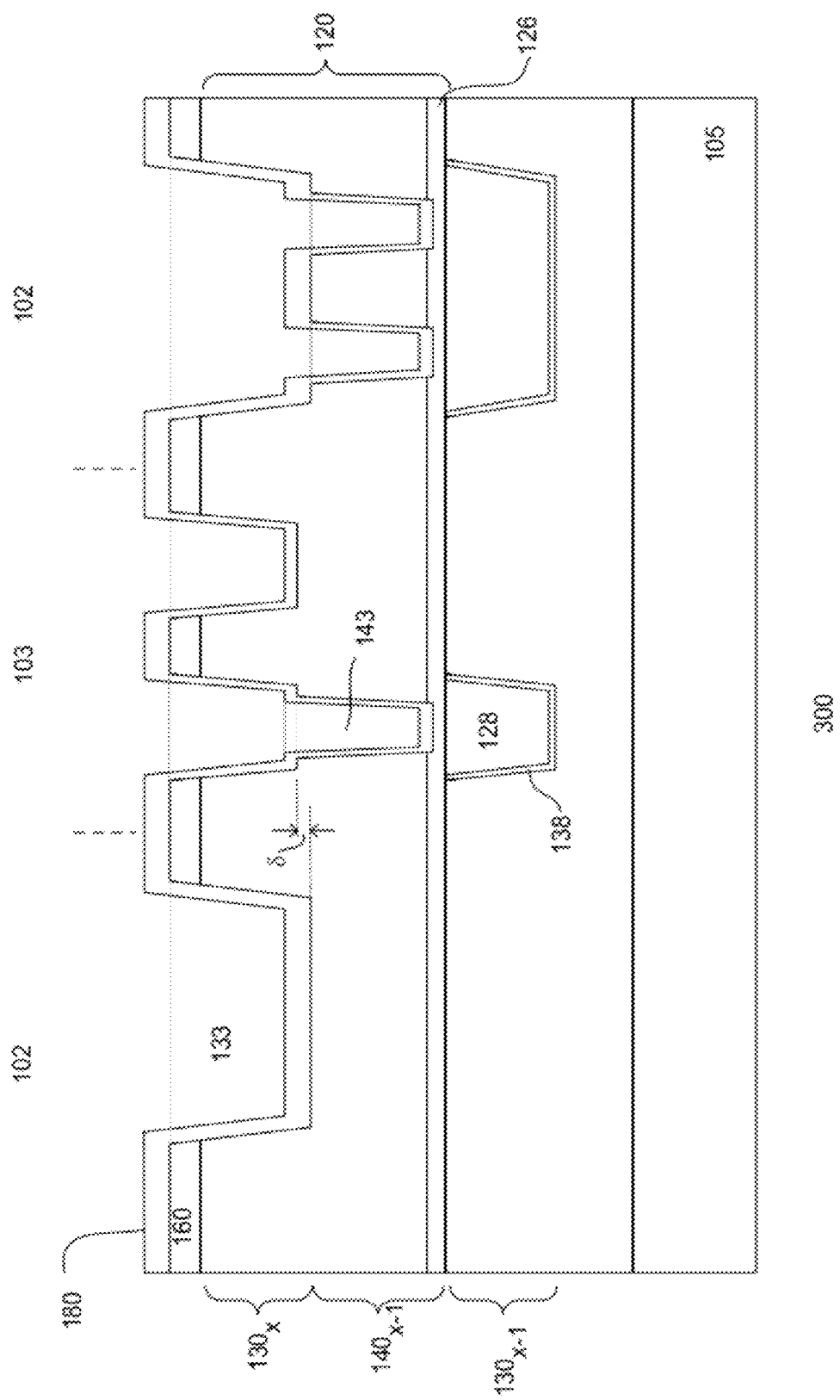

In accordance with one embodiment, a non-conformal layer 180 is formed on the substrate, as shown in FIG. 3b. The non-conformal layer lines the surface of the IMD layer. For example, the non-conformal layer lines the hard mask 160 and the dual damascene structures. The non-conformal layer comprises, for example, silicon oxide. In one embodiment, the non-conformal layer comprises a low temperature oxide (LTO). Other types of non-conformal layers may also be useful. Preferably, the material of the non-conformal layer can easily be removed selective to the IMD layer. For example, the material of the non-conformal layer can easily be removed selective to the IMD layer using a dilute HF clean. The non-conformal material, for example, is a low quality material which enables it to be easily removed.

In one embodiment, the non-conformal layer is formed by CVD. The LTO, for example, is deposited at temperature of about 200° C. The deposition rate of the non-conformal layer is faster on the horizontal surface than on the non-horizontal surface. This results in the horizontal component of the non-conformal layer being thicker than the non-horizontal component. For example, the thickness of the non-conformal layer on the surface of the IMD (hard mask) and bottom of the trenches is greater than that on the sidewalls of the dual damascene structure. There may not be much non-conformal material on the bottom of the vias due to the high aspect ratio.

The non-conformal layer passivates the IMD layer. For example, the non-conformal layer fills the pores of the ULK material of the IMD layer. Passivating the ULK material helps reduce shrinkage during subsequent metallization process to fill the dual damascene structures.

In one embodiment, the thickness of the non-conformal layer in the wide regions is greater than in the narrow regions. The differential in thickness between the wide and narrow regions should be sufficient to reduce the depth $\delta$ of the wide and narrow trenches. Preferably, the differential in thickness of the non-conformal layer in the wide and narrow trenches is sufficient to produce wide and narrow trenches having about the same depth (e.g., $\delta{\sim}0$). The difference in depth between the wide and narrow trenches, for example, may be about 10-25 nm or less. The thickness of the non-conformal layer in the horizontal portion of the wide region may have a target thickness of, for example, about 10-25 nm while the thickness in the narrow region may be about 40-60% less than the target thickness. Other thicknesses of the non-conformal layer for the horizontal portions in the wide and narrow regions may also be useful.

Figure 3C:
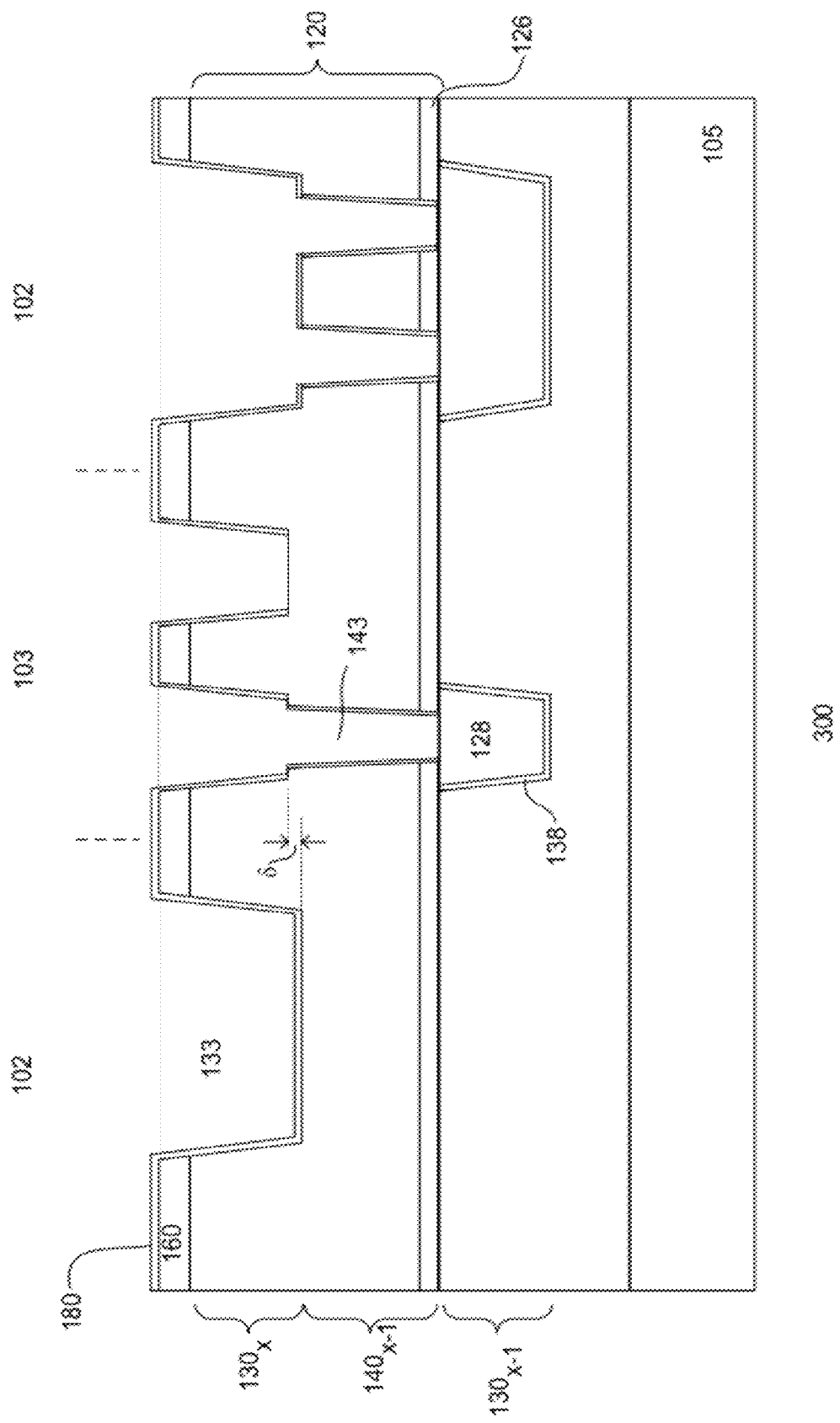

In FIG. 3c, an etch is performed to remove portions of the lower etch stop layer protecting the contact region. The etch exposes the lower contact area. The etch, for example, comprises an anisotropic etch, such as RIE. The etch may be, for example, a CF based etch. In one embodiment, the etch chemistry comprises fluorocarbons (e.g. $C_4F_6$). Other types of etch chemistry which can etch the etch-stop layer are also useful. The etch also removes some of the non-conformal layer. Preferably, the etch removes the non-conformal layer in the narrow trenches and bottom of the vias while leaving an amount over the wide trenches. There may be an amount of the non-conformal layer on trench sidewalls.

Figure 3D:
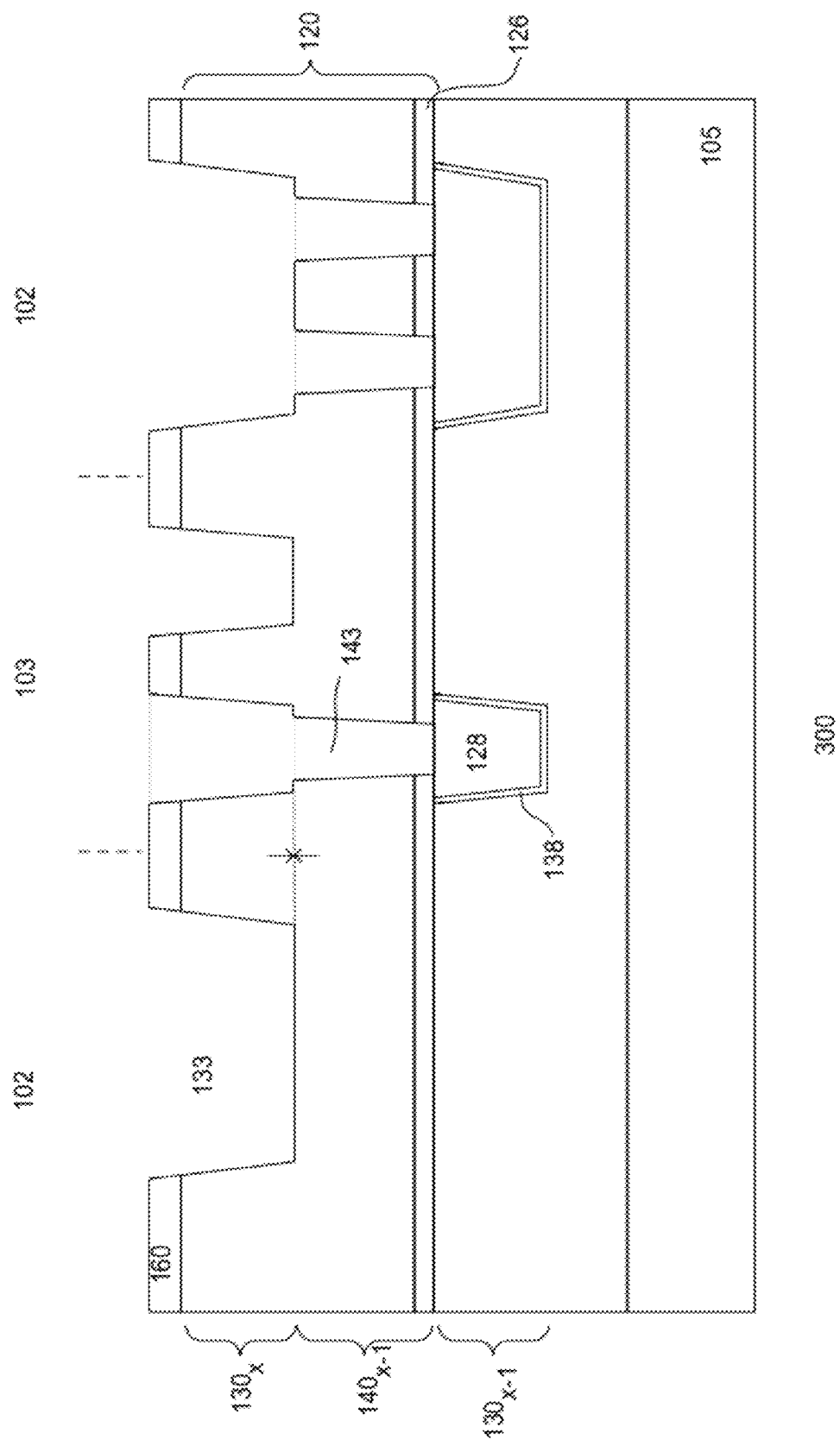

As shown in FIG. 3d, the substrate is cleaned. Cleaning comprises, for example, a diluted hydrofluoric acid (DHF) clean. Other types of clean chemistry may also be useful. The clean removes the non-conformal layer as well as damaged portions of the IMD layer caused by RIE to form the dual damascene structures. The material of the non-conformal layer has a lower etch rate than the IMD material. This allows the narrow trenches to be etched further and faster than the wide trenches to reduce the $\delta$.

Figure 3E:
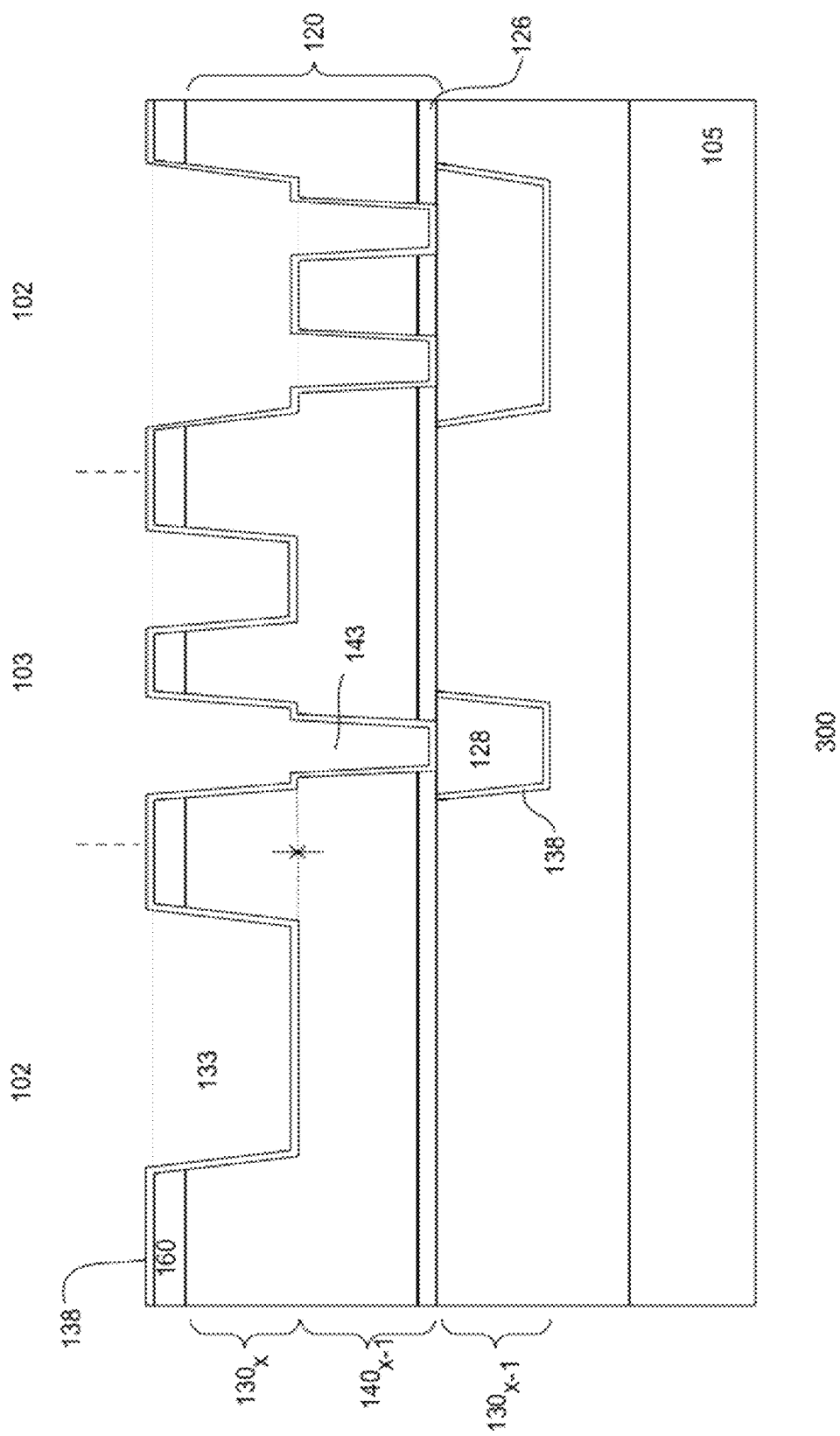

In FIG. 3e, a barrier layer 138 is deposited on the substrate, lining the IMD layer, including the trenches and vias. The barrier layer, for example, can comprise TaN, Ta, TiN or a combination thereof. Other types of barrier material, such as ruthenium, are also useful. Providing a barrier layer having multiple layers is also useful. The barrier can be formed by, for example, PVD, CVD or atomic layer deposition (ALD). Other techniques for forming the barrier are also useful. For example, the barrier layer may be formed by electroplating.

Figure 3F:
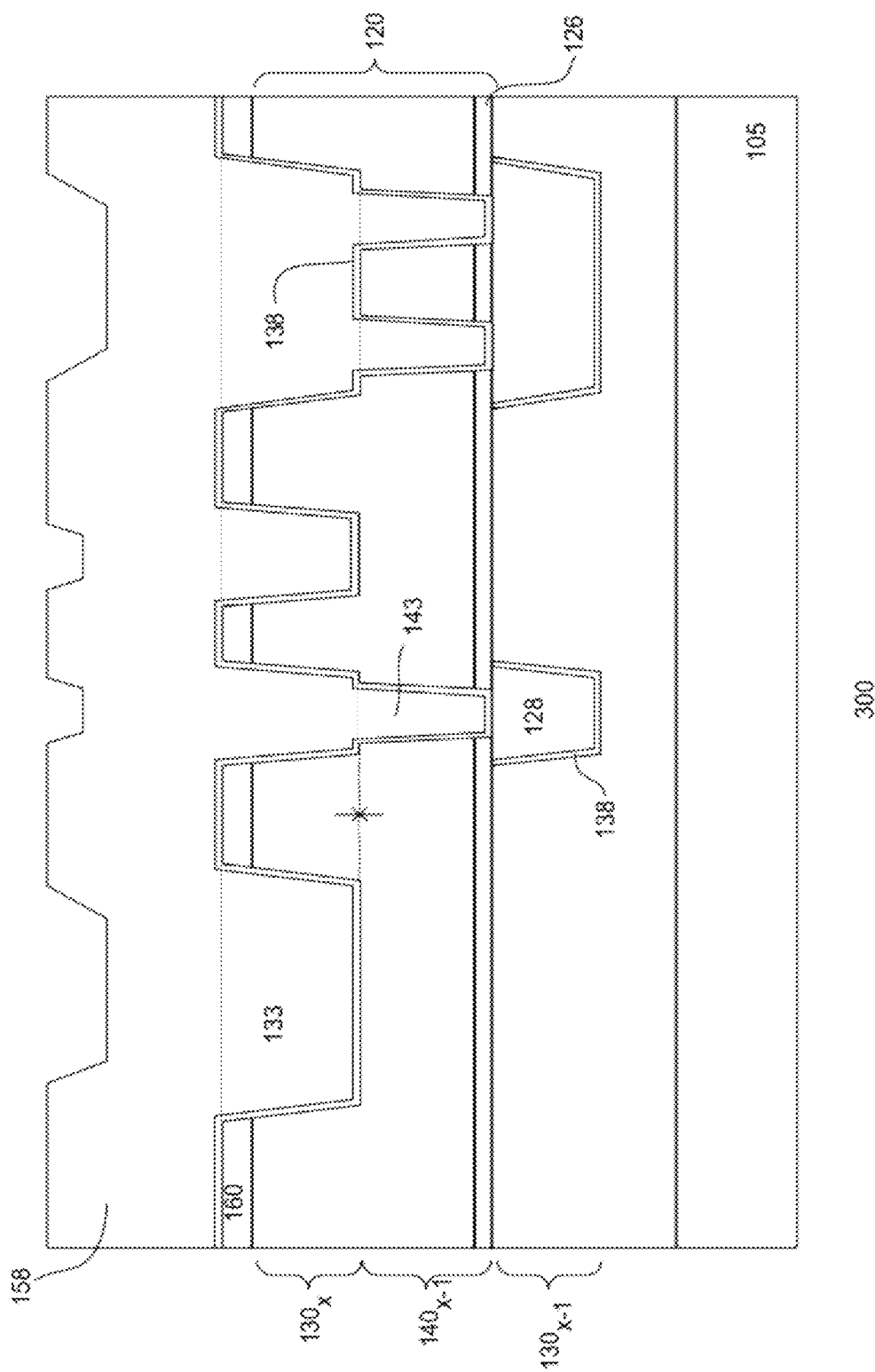

A conductive material 158 is deposited or formed on the substrate, covering the barrier and filling the trenches and vias, as shown in FIG. 3f. The conductive material, for example, comprises copper, aluminum, tungsten, alloys such as Al doped Cu, Mn doped Cu, or a combination thereof. Other types of conductive materials, including metals and alloys, are also useful. In one embodiment, the conductive material comprises copper. A copper seed layer (not shown) may be first formed over the barrier layer by, for example, PVD. The conductive material can be deposited by electroplating. Other techniques, such as electro-less plating, CVD, PVD or sputtering, are also useful. The technique employed may depend on the material used.

Figure 3G:
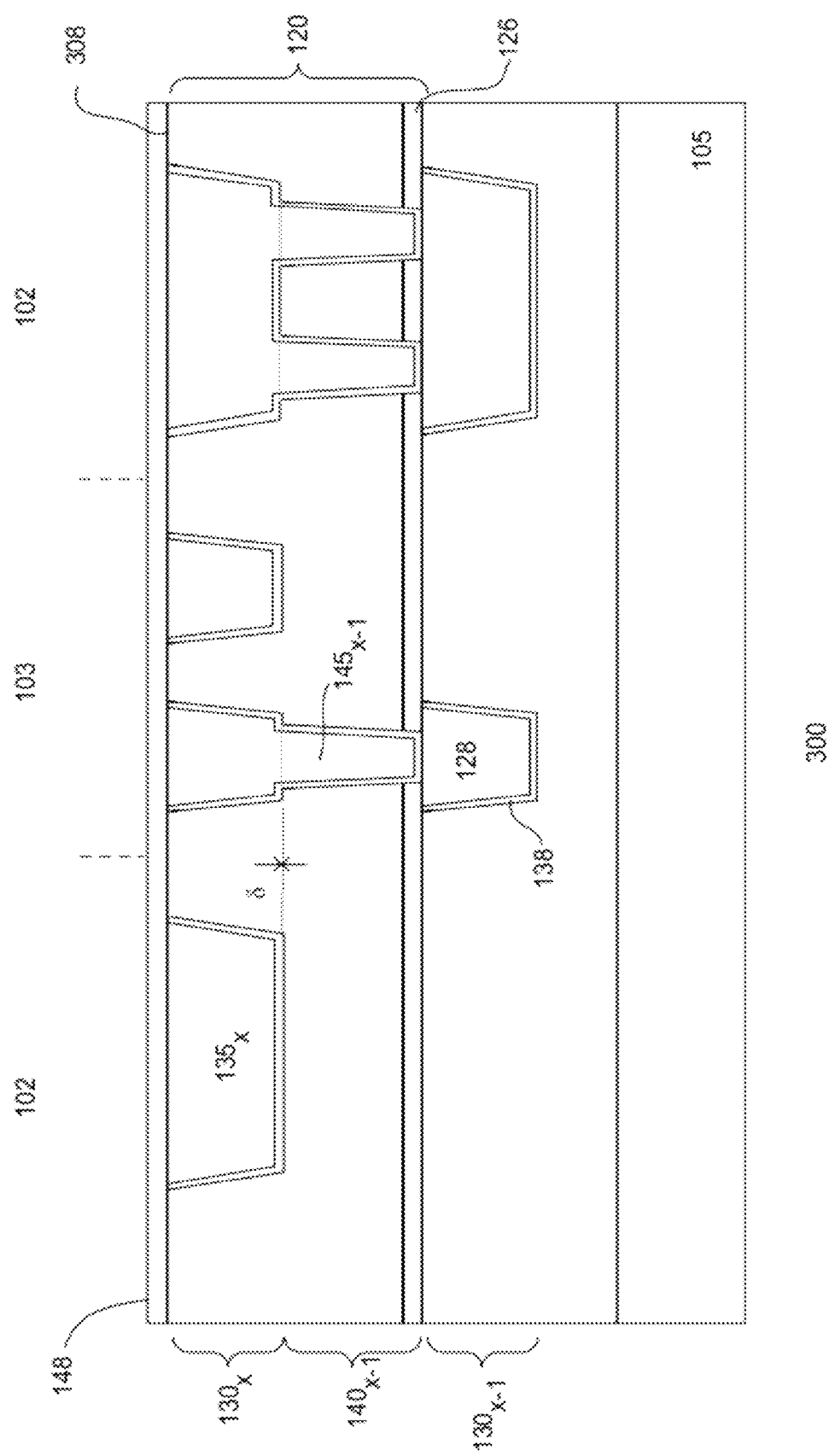

Referring to FIG. 3g, excess conductive material is removed to form interconnects $135_x$ and vias $145_{x-1}$. In one embodiment, the excess material is removed by a planarizing process. The planarizing process removes excess conductive material, liner layer and hard mask over the IMD layer. This results in a planar top surface 308 between the conductive material and the IMD layer. The planarizing process comprises, for example, a polishing process, such as chemical mechanical polishing (CMP), electro-CMP (eCMP) or a combination thereof. Other types of planarizing or polishing processes are also useful. The polishing process may include multiple polishing steps to remove the different materials, such as the conductive and barrier materials.

An upper etch stop layer 148 is formed on the surface of the hybrid IMD layer. The etch stop layer, for example, serves as a capping layer of the IMD layer. In one embodiment, the etch stop layer comprises SiC. Other types of etch stop layer can also be formed on the top surface of the IMD layer. The etch stop layer, for example, can be formed by CVD or other deposition techniques.

The process continues to form the IC. For example, additional processing can include forming more interconnect layers and interconnections, final passivation, dicing, assembly and packaging. Other processes are also useful.

As described, the non-conformal layer is used in dual damascene structures to compensate for RIE lag to reduce depth delta between wide and narrow trenches. The non-conformal layer may be used with other applications in which depth delta between wide and narrow features occur. For example, the conformal layer may be used in the context of damascene structures.

Figure 4A:
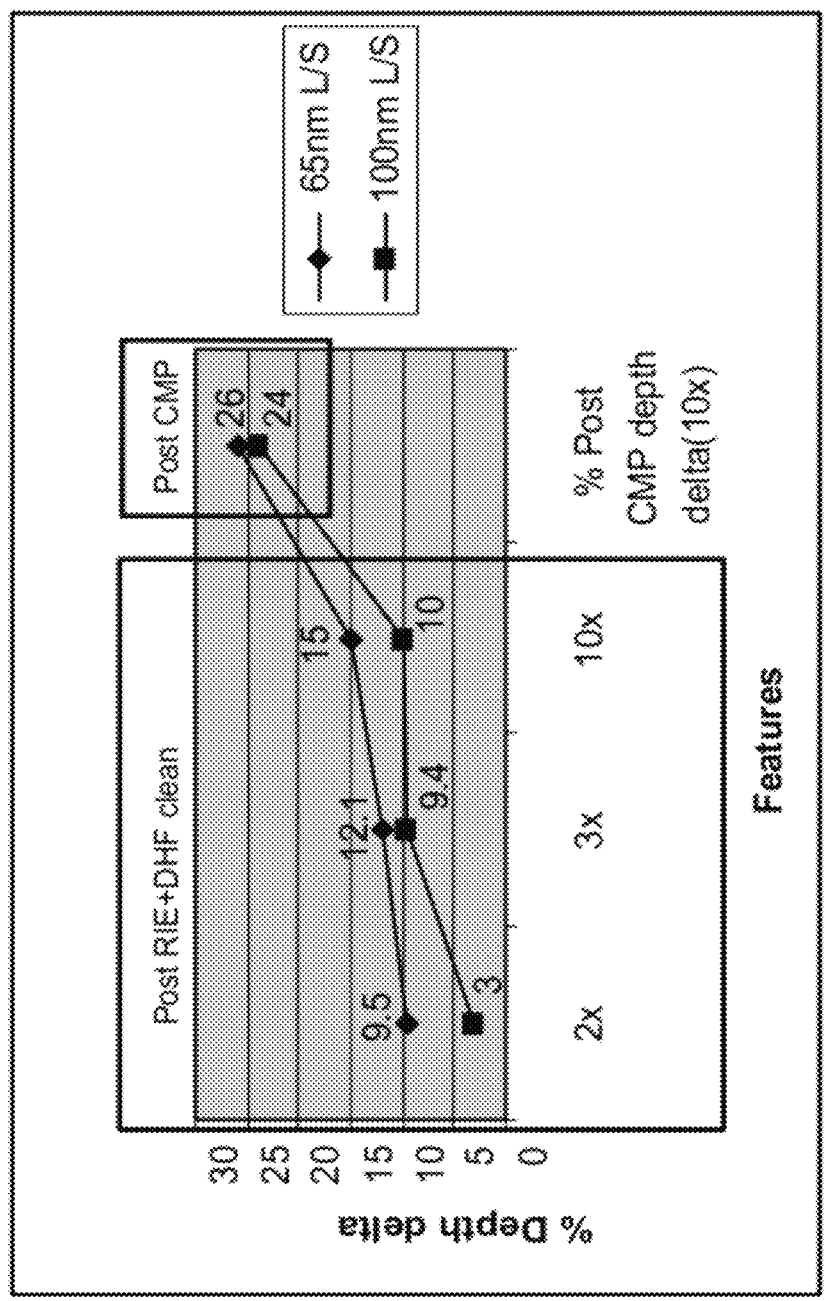
FIGS. 4a-b show depth delta of wide and narrow trenches of dual damascene structures.
Figure 4B:
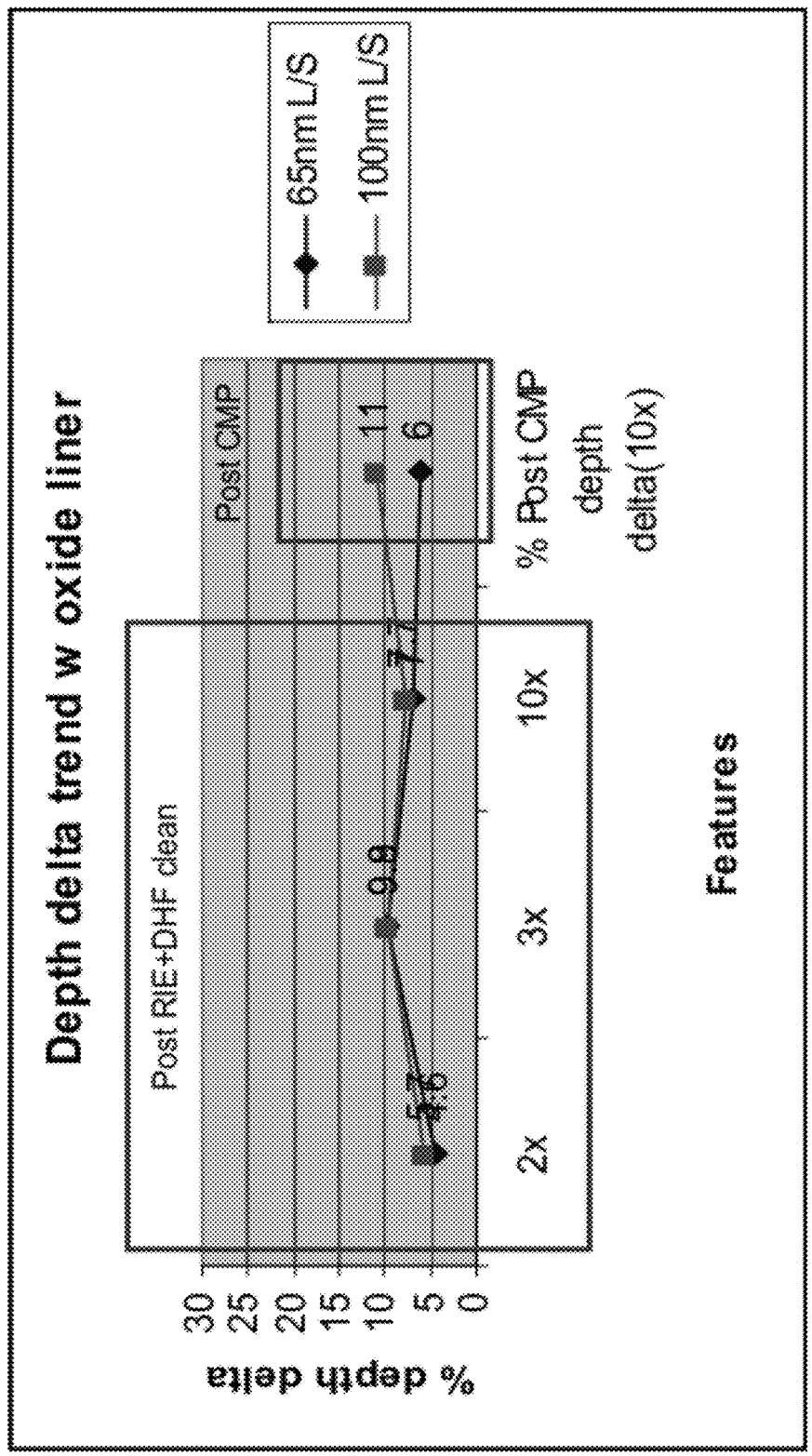

FIGS. 4a-b show depth δ of wide and narrow trenches of dual damascene structures with and without the use of a non-conformal layer, respectfully. The experiment measured the depth delta of narrow and wide trenches. As shown, the depths are measured for wide trenches having 2×, 3× and 10× against narrow trenches of x, where x is the nominal width of the narrow trenches. The measurements were measured for trenches at 65 nm and 100 nm. The depths of the narrow and wide trenches were measured post RIE and DHF clean and percentage of depth delta for design rule lines 65 nm and 100 nm is plotted. Also, the depth of 10× wide and narrow trenches were measured post CMP, which is after the formation of the interconnects. The percentage of depth delta is plotted. For 65 nm, it can be seen that a reduction of 20-50% of the percentage in depth delta is achieved when a non-conformal liner is used measured post RIE and DHF clean, depending on the width of wide trenches while about 65% reduction is achieved post CMP for 10× width trenches.

Figure 5B:
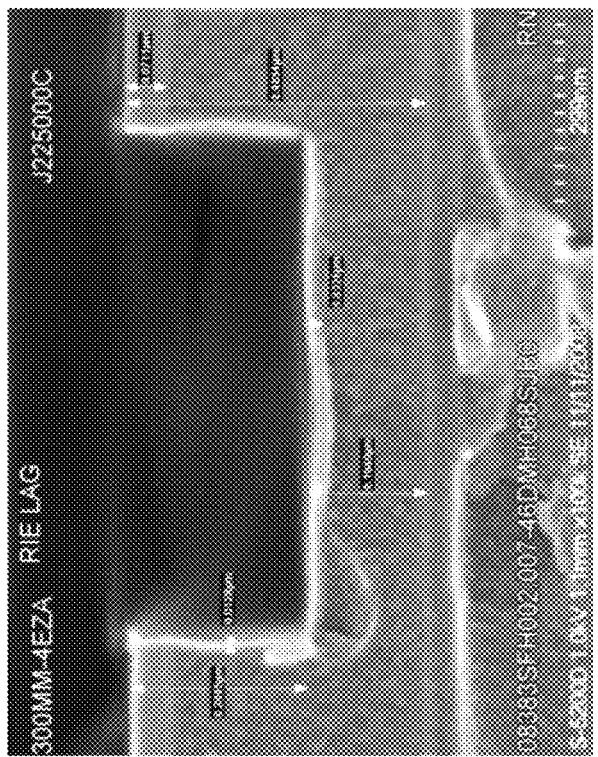
FIGS. 5a-b show SEMs of wide and narrow trenches.
Figure 5A:
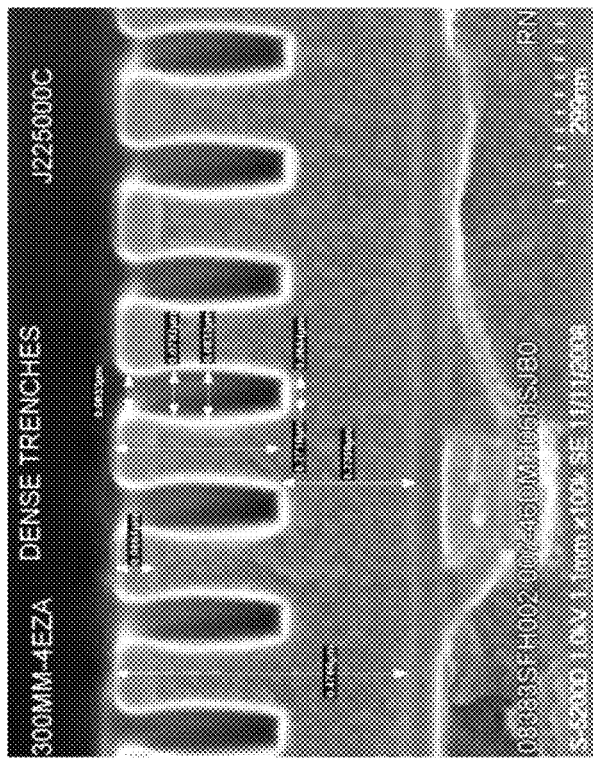

FIGS. 5a-b show SEMs of dense and wide trenches. From FIGS. 5a-b, it shows that the depth of the wide trenches is greater than the narrow trenches. This is due to RIE lag.

Figure 6A:
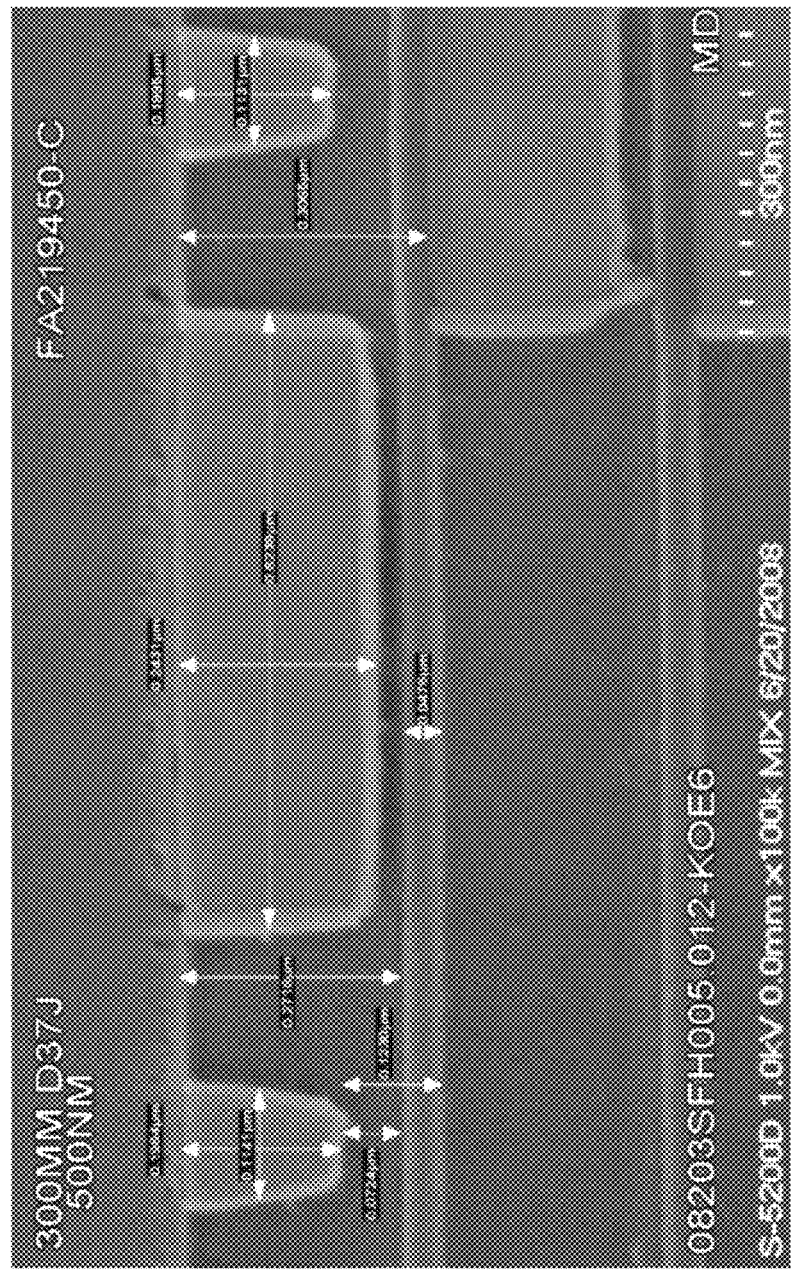
FIGS. 6a-b show SEMs of portions of a device.
Figure 6B:
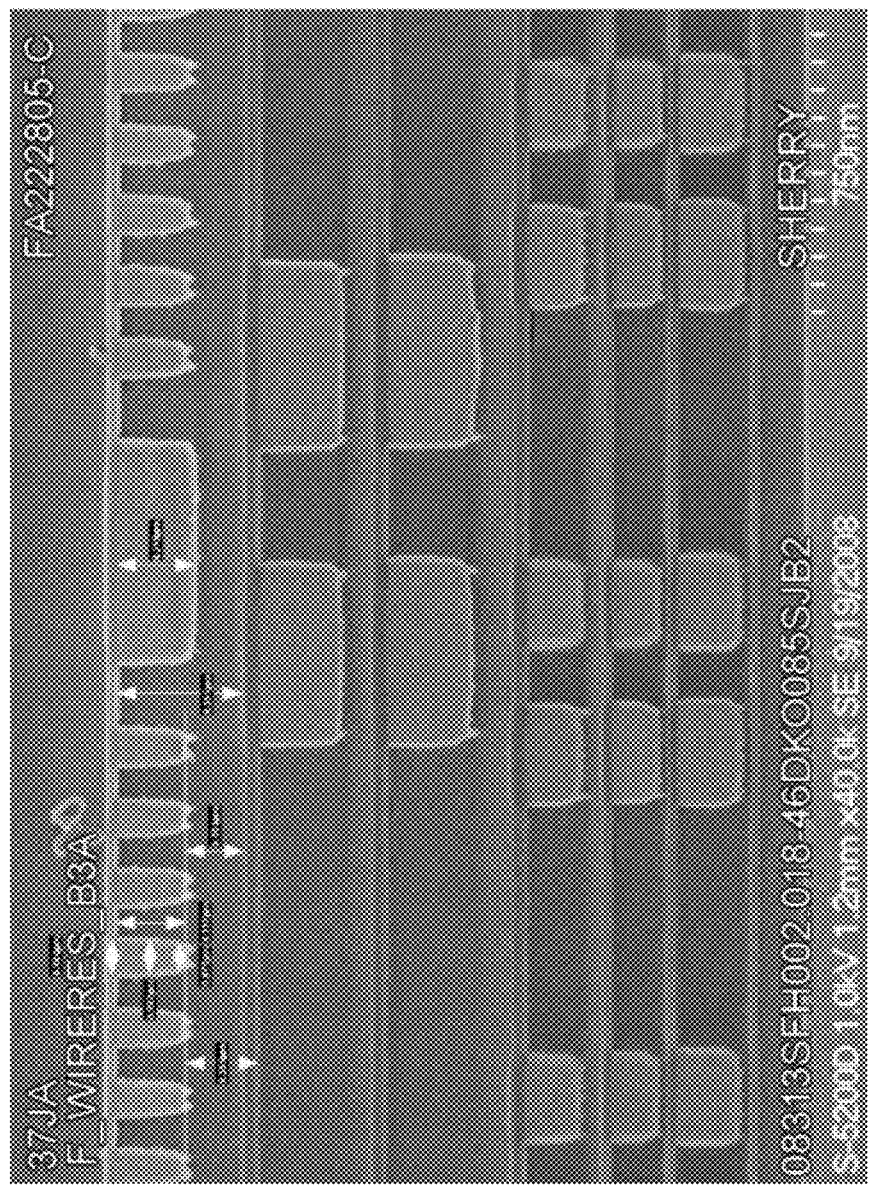

FIGS. 6a-b show SEMs of portions of a device with wide and dense trenches with and without the use of a non-conformal layer, respectively. As shown, the depth delta of the trenches without the use of non-conformal layer is greater than the depth delta of trenches using a non-conformal layer. Referring to FIG. 6a, dense trenches and wide trenches have a depth δ of about 24%. However, when a non-conformal layer is employed, the depth δ of the dense and wide trenches is about 11%.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method of forming a device comprising:
   providing a substrate prepared with a dielectric layer where interconnects are to be formed,
   the dielectric layer comprising
   trenches for lines and
   vias for contacts,
   the trenches being above the vias,
   the dielectric layer having first and second regions,
   wherein the first region comprises wide trenches and the second region comprises narrow trenches, and
   wherein a depth delta exists between bottoms of the wide and narrow trenches;
   forming a non-conformal layer on the substrate,
   the non-conformal layer lining the wide and narrow trenches in the first and second regions;
   etching the non-conformal layer in the wide and narrow trenches
   to expose areas of the dielectric layer in the narrow trenches and
   to remove the non-conformal layer from the bottom of the vias
   while leaving an remaining amount of the non-conformal layer over the wide trenches; and
   reducing the depth delta between the bottoms of the wide and narrow trenches in the first and second regions
   by etching the remaining amount of the non-conformal layer and the dielectric layer,
   the non-conformal layer having a lower etch rate than the dielectric layer, thereby allowing the narrow trenches to be etched further and faster than the wide trenches.

2. The method of claim 1 wherein a depth of the wide trenches in the first region is deeper than a depth of the narrow trenches in the second region.

3. The method of claim 2 wherein a percentage of the depth delta between the wide and narrow trenches is reduced by at least about 20-50%.

4. The method of claim 3 wherein forming the non-conformal layer comprises forming a non-conformal oxide layer.

5. The method of claim 1 wherein a percentage of the depth delta between the wide and narrow trenches is reduced by at least about 20-50%.

6. The method of claim 5 wherein forming the non-conformal layer comprises forming a non-conformal oxide layer.

7. The method of claim 1 wherein forming the non-conformal layer comprises forming a non-conformal oxide layer.

8. The method of claim 1
   wherein removing the non-conformal layer exposes contact regions for communication with the interconnects to be formed within the vias.

9. The method of claim 8
   wherein the contact regions for communication with the interconnects to be formed within the vias comprise lower interconnects.

10. The method of claim 1 wherein the non-conformal layer comprises silicon oxide or a low temperature oxide.

11. The method of claim 1 wherein thickness of the non-conformal layer in the first region is greater than in the second region.

12. A method of forming a device comprising:
providing a substrate prepared with a dielectric layer having first and second regions,
  wherein the first region comprises wide dual damascene features and the second region comprises narrow dual damascene features,
  the dual damascene features comprising trenches for lines and vias for contacts, the vias being below the trenches,
  wherein a depth delta exists between bottoms of wide and narrow trenches;
forming a non-conformal layer on the substrate,
  the non-conformal layer lining the wide and narrow dual damascene features in the first and second regions; and
etching the non-conformal layer in the wide and narrow trenches
  to expose areas of the dielectric layer in the narrow trenches and
  to remove the non-conformal layer from the bottom of the vias
  while leaving a remaining amount of the non-conformal layer over the wide trenches; and
reducing the depth delta between the bottoms of the wide and narrow trenches in the first and second regions
  by etching the remaining amount of the non-conformal layer and the dielectric layer,
  the non-conformal layer having a lower etch rate than the dielectric layer, thereby allowing the narrow trenches to be etched further and faster than the wide trenches.

13. The method of claim 12 wherein a depth of the wide trenches in the first region is deeper than a depth of the narrow trenches in the second region.

14. The method of claim 13 wherein a percentage of the depth delta between the wide and narrow trenches is reduced by at least about 20-50%.

15. The method of claim 12 wherein forming the non-conformal layer comprises forming a non-conformal oxide layer.

16. The method of claim 15 wherein a percentage of the depth delta between the wide and narrow trenches is reduced by at least about 20-50%.

17. The method of claim 12 wherein the thickness of the non-conformal layer
  in the narrow trench is about 40-60% less than the thickness in the wide trench.

18. The method of claim 17 wherein removing the non-conformal layer further comprises performing a cleaning process after performing the etch to remove the remaining non-conformal layer.

* * * * *